United States Patent [19]

Covell, II et al.

[11] Patent Number: 5,718,367
[45] Date of Patent: Feb. 17, 1998

[54] MOLD TRANSFER APPARATUS AND METHOD

[75] Inventors: James Howard Covell, II, Poughkeepsie; Carol Jill Braun, LaGrangeville, both of N.Y.

[73] Assignee: International Business Machines Corporation, Armonk, N.Y.

[21] Appl. No.: 562,079

[22] Filed: Nov. 21, 1995

[51] Int. Cl.[6] .................................................. H01L 21/441
[52] U.S. Cl. ........................ 228/254; 228/180.22; 164/98
[58] Field of Search ........................... 228/180.22, 253, 228/254, 212; 164/47, 98

[56] References Cited

U.S. PATENT DOCUMENTS 4,893,403  1/1990  Hefling et al. ............... 228/180.22
5,381,848  1/1995  Trabucco ..................... 228/254 X
5,388,327  2/1995  Trabucco ..................... 228/253 X Primary Examiner—Kenneth J. Ramsey
Attorney, Agent, or Firm—Aziz M. Ahsan

[57] ABSTRACT

The present invention relates generally to a new mold transfer apparatus and method. More particularly, the invention encompasses an apparatus that is used to form metallic interconnections, such as, for example, solder connections, such as, solder balls or solder columns, using a mold that is already filled with transferable metallic material. However, these metallic interconnections in a mold could also be used to form other structures, such as, for example, heat sinks with fins, etc.

67 Claims, 2 Drawing Sheets

MOLD TRANSFER APPARATUS AND METHOD

CROSS-REFERENCE TO RELATED PATENT APPLICATION

This patent application is related to U.S. patent application Ser. No. 08/561,571, entitled "Apparatus and Method for Forming Mold for Metallic Material", filed on Nov. 21, 1995, which is assigned to the assignee of the instant Patent Application, and the disclosure of which is incorporated herein by reference.

FIELD OF THE INVENTION

The present invention relates generally to a new mold transfer apparatus and method. More particularly, the invention encompasses an apparatus that is used to form metallic connections, such as, for example, solder interconnections, such as, solder balls or solder columns, using a mold that is already filled with transferable metallic material. However, these metallic connections in a mold could also be used to form other structures, such as, for example, heat sinks with fins, etc.

BACKGROUND OF THE INVENTION

Semiconductor devices are becoming more prevalent in our society. The semiconductor manufacturers are therefore constantly being challenged to improve the quality of their products and to reduce their costs. Whereas significant improvements are being made to the processes used. Process improvements alone are not sufficient to reduce costs and increase quality of the semiconductor devices.

The semiconductor industry has used a variety of approaches to achieve electrical and mechanical interconnections. Following are some examples of the processes and apparatuses:

U.S. Pat. No. 4,434,134 (Darrow et al.), entitled "Pinned Ceramic Substrate" describes a sintering method to form pins in a ceramic substrate using powdered metallurgy paste. It uses a consumable mold with preformed holes which are mated to the sintered powdered filled holes of a ceramic substrate. The holes in the mold are then filled with powdered metallurgy paste and the mold/substrate assembly is heat treated to evaporate the mold and fuse the sintered metallurgy of the mold holes with sintered metallurgy in the ceramic holes to form pins.

U.S. Pat. No. 4,914,814 (Behun et al.) entitled "Process of Fabricating a Circuit Package" discloses a low cost process for fabricating solder column interconnections for an electronic package. Basically, an array of pin holes in a pin mold is filled with lead-tin solder, which are in registration with an array of conductive pads. The whole assembly is heated such that the solder becomes molten and coalesces with the array of the conductive pads, and the pin mold is then removed.

U.S. Pat. No. 5,029,748 (Lauterbach et al.), entitled "Solder Preforms in a Cast Array" describes a method to cast solder preforms to be used in a reflow solder process to join electrical connector pins to plated though holes in a printed circuit board. The solder preforms can be cast directly onto the pins in a through-hole printed circuit board connector. The pins and preforms can be inserted into the plated through-holes of the printed circuit board.

U.S. Pat. No. 5,048,747 (Clark et al.), entitled "Solder Assembly of Components" describes a method of attaching a first component to a second component. Precise amounts of solder are provided to each pad. The holes in the component are aligned with the pads and the solder is reflowed so that a visible solder fillet is formed above the holes to permit inspection of the solder joint.

U.S. Pat. No. 5,244,143 (Ference et al.), entitled "Apparatus and Method for Injection Molding Solder and Application Thereof", primarily addresses injection molding solder molds directly onto electronic component. A method for mold filling and transfer to a substrate is also disclosed. The invention provides for uniform solder volumes on the corresponding component grid array.

However, a cost effective method is required to produce metallic interconnects, such as, for example, solder interconnects. As an example, utilizing solder filled molds of this invention provides a low cost solution. The material cost of solder filled molds is an order of magnitude less than using the traditional solder ball and paste to form BGA (Ball Grid Array) or SBC (Solder Ball Connect) and pre-cut wire to form solder CGA (Column Grid Array) module interconnections.

This invention also provides an apparatus that uses molds that are pre-filled with solid metallic interconnects. The filled molds are mated with a carrier and the assembly is heated to reflow and wet the metallic material, such as, solder, to the metallurgical pads on a semiconductor device, such as, a substrate. However, the same apparatus and process could be used to form other types of structures, such as, for example, a heat sink with fins.

PURPOSES AND SUMMARY OF THE INVENTION

The invention is a novel mold transfer method and an apparatus for forming arrays of metallic structures or interconnect structures using molds which are already filled with transferable metallic material.

Therefore, one purpose of this invention is to provide an apparatus and a method that will provide a reliable and repeatable process and apparatus.

Another purpose of this invention is to provide for transfer of molded or cast features onto a part.

Still another purpose of this invention is to have a means of aligning mold to the part.

Yet another purpose of this invention is to provide a reliable means of transferring cast structures in a mold without damaging the mold or the cast structure.

Still yet another purpose of the invention is to transfer cast preforms into a finished product.

Yet another purpose of the invention is to be able to transfer from a mold that has various shaped interconnections, such as CGA (Column Grid Array) and BGA (Ball Grid Array).

Therefore, in one aspect this invention comprises a method of transferring cast electrical interconnects from a mold to an attachment pad, comprising the steps of:

(a) placing a workpiece having said attachment pad onto a base having at least one alignment means, (b) placing said mold over said workpiece such that said alignment means aligns at least a portion of one of said electrical interconnects in physical contact with at least a portion of said pad, (c) placing at least one biasing means over said mold and forming an assembly with said base, mold and workpiece, (d) heating said assembly to a temperature where at least a portion of said electrical interconnects in contact with said pad melts and forms an electrical connection with said pad, and (e) cooling said assembly and removing said biasing means, said mold and thereby forming said workpiece having said attachment pad with said cast electrical interconnects.

In another aspect this invention comprises a method of transferring cast metallic material from a mold to a workpiece, comprising the steps of:
(a) placing said workpiece onto a base having at least one alignment means,
(b) placing said mold over said workpiece such that said alignment means aligns at least a portion of said metallic material in physical contact with at least a portion of said workpiece,
(c) placing at least one biasing means over said mold and forming an assembly with said base, mold and workpiece,
(d) heating said assembly to a temperature where at least a portion of said metallic material in contact with said workpiece melts and forms a connection with said workpiece, and
(e) cooling said assembly and removing said biasing means and said mold, and thereby forming said workpiece having said cast metallic material.

In yet another aspect this invention comprises an apparatus for transferring cast metallic material in a mold onto a workpiece, comprising:
(a) a base having at least one alignment pin,
(b) at least one area in said base to accommodate said workpiece, said workpiece in said area,
(c) means for placing and aligning said mold over said workpiece,
(d) at least one biasing means over said mold to securely hold said mold in contact with said workpiece,
(e) a heating means to heat said assembly comprising said biasing means, said mold, said workpiece and said base until said cast metallic material in said mold is transferred onto said workpiece, and
(f) a cooling means to cool said assembly and thereby providing said apparatus for transferring cast metallic material in a mold onto a workpiece.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

DETAILED DESCRIPTION OF THE INVENTION

This invention discloses an apparatus and a method using molds having pre-filled metallic features, such as, for example, solder, and where the metallic features are locked in place to form cast metallic interconnects.

For the ease of understanding this invention solder will be used as the metallic material to illustrate the contents of the pre-filled mold, however, it should be understood that any material that can be cast or molded can be used to fill the mold that is used with this invention.

These metallic interconnects in the mold can be easily transferred onto the desired component to form interconnect structures, such as column, pins or balls. This transfer is typically done by aligning the cast interconnect in the mold with a carrier, such as, a semiconductor device or substrate, and then heating and reflowing the interconnects and thereby joining them to the semiconductor carrier.

It is preferred that the interconnects in the mold are physically in contact with metallurgical pads on the semiconductor device, such as, a substrate. The shape of the openings in the mold determines the final interconnect structure shape. This invention allows for the easy inspection of the cast interconnection surface. The surface can be inspected before it is mated or joined to a semiconductor device or carrier.

Figure 1:
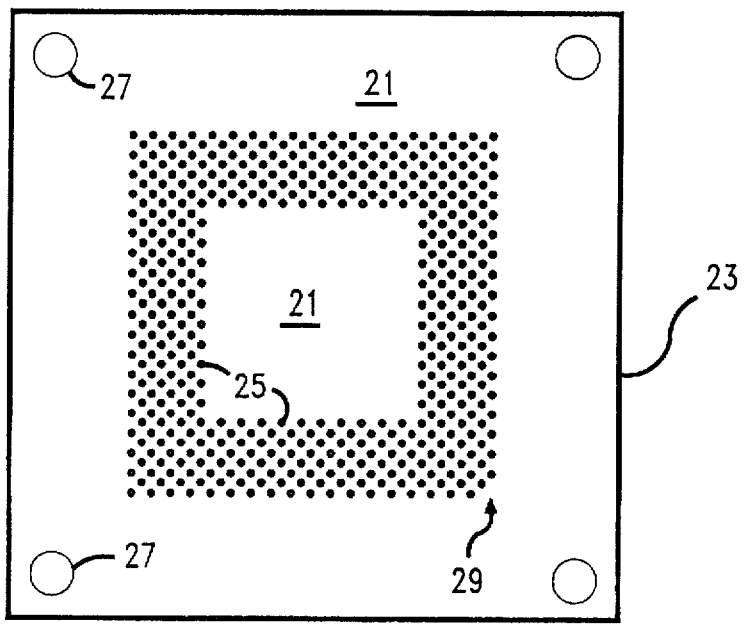
FIG. 1, illustrates a top view of a mold having pre-formed metallic features.

FIG. 1, illustrates a mold 23, having a plurality of openings 25. For orientation or similar other purposes one could have an area 29, that does not have any opening 25. Similarly, one could have an area 21, in the mold that does not have any opening 25. For alignment or similar other purposes it is preferred to have at least one opening 27, in the mold 23.

Any material can be used to make the mold 23, as long as it can withstand the service temperatures and has dimensional stability. For the purposes of understanding this invention, however, the preferred material that was used to make the mold 23, was a carbon-graphite composite of the appropriate grade with a thermal coefficient of expansion (TCE) that closely matched the TCE of the semiconductor device to which it was to be mated, as will be explained in more detail later. One such composite used, for example, was DFP-1, manufactured by POCO Graphite Incorporated, Decatur, Tex., USA, having a TCE of about $4.27 \times 10E6$ inches per inch per degree Fahrenheit.

Graphite has been found to be an ideal mold material due to its TCE (Thermal Coefficient of Expansion) match to ceramic substrates, non-wettable surface and releasing properties.

The material for the mold should also be inert to the material that it will be filled with, such as, molten solder, such as, for example, about 10 percent tin and about 90 percent lead.

The mold 23, itself could be made from, for example, a group comprising boron nitride, ceramic, copper, epoxy, glass, graphite, metals, metal ceramics, molybdenum, plastics, polyimides or silicon, to name a few.

The material that is used to fill the opening 25, in the mold 23, itself could be selected from a group comprising, aluminum, antimony, bismuth, copper, gold, lead, silver, tin or alloys thereof. However, conductive epoxies could also be used to fill the openings 25, in the mold 23.

The shape of the opening 25, could be selected from a group comprising, triangular shape, rectangular shape, polygonal shape, elliptical shape or any odd shape, to name a few.

The workpiece or the substrate could be selected from a group comprising, board, card, ceramics, chip, glass-ceramics, heat-sink, laminate or semiconductor substrate, to name a few.

The mold 23, should also possess sufficient dimensional stability for use at an appropriate service temperature, for example, about 350° C. At the service temperature the mold 23, must be able to retain adequate flatness and parallelism for successful filling of the openings 25. This filling of the openings 25, could be done using any type of an injection molded solder device, such as, for example, the apparatus disclosed in U.S. Pat. No. 5,244,143 (Ference et. al.), the disclosure of which is incorporated herein by reference.

The mold 23, could also be used to form a column grid preform array of tin lead solder, such as, a 10–90 (by weight) tin lead solder, for attachment to an electronic device, such as, a ceramic substrate.

Figure 2:
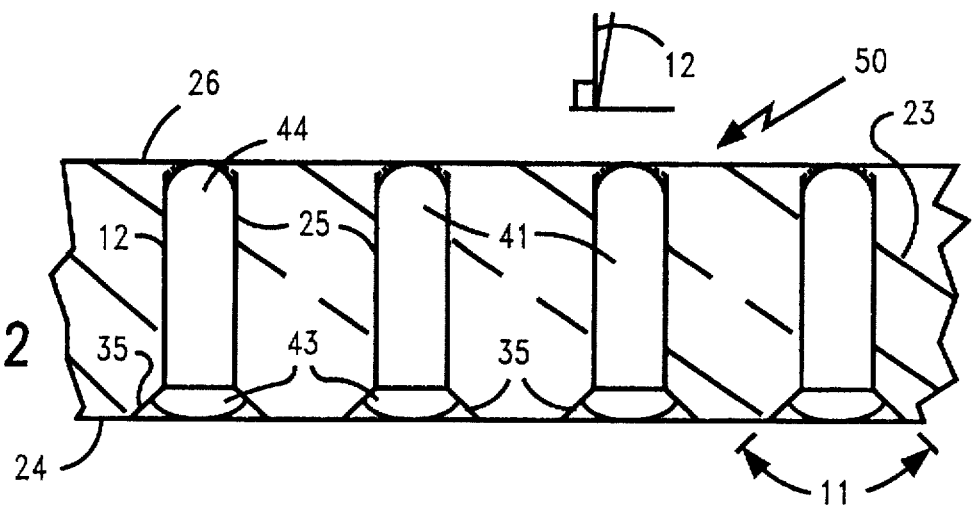
FIG. 2, illustrates a cross-sectional view of a mold having pre-formed metallic features that were formed in a relatively inert environment.

As shown in FIG. 2, the mold 23, has a lower surface 24, and an upper surface 26, and mold cavities or holes 25. It is preferred that the mold cavities or holes 25, have at least a small taper or draft angle 12. This taper 12, is primarily incorporated to facilitate the ejection of the cast solder mold after it has been attached to the semiconductor device, such as, a ceramic substrate.

It is also preferred for some applications that one of the surfaces of the mold 23, also has a flared end 35, having a flare angle 11, for the mold cavity 25. As will be discussed later, this flared end 35, will form a fillet area at the device attachment site. In addition to minimizing attachment point stress, this flared area 35, also ensures solder contact with the substrate metallized pads due to the bulging phenomenon as explained later.

The mold filling is accomplished by aligning the lower surface 24, of the mold 23, against a flat or backing plate (not shown). The flat plate chosen for this application was made from graphite, however, any compatible material, depending upon the application, can be used.

The unfilled mold 23, was heated to about 345° C. minimum, and then this heated assembly was driven under the injection head of a solder injection molding machine, in an inert atmosphere, such as, containing minimal oxygen or less than 500 PPM (Parts Per Million) of oxygen by volume. Solder 41, was then injected into the through-hole 25, and the solder formed a bulge-like structure 43, within the flare area 35. This bulge like structure is due to the higher surface tension forces in an inert atmosphere. For most applications it is preferred to have some extra material at the tail end 44, of the solder 41, at the open end of the hole 25. However, for some applications and with the use of an appropriate molding device and/or atmospheric conditions the area 44, might be kept flush with the upper surface 26, of the mold 23.

The process of filling the cavities 25, with the solder 41, itself is limited in speed by the liquid flow rate within the solder injection head and heating capacity of the molding equipment.

After the solder 41, has solidified, the filled mold 23, is separated from the base or backing plate to form a filled or cast mold 50. The filled mold 50, can now either be used to immediately attach the cast solder 41, to a workpiece or carrier 95, or the filled mold 50, could be stored as a stocked item to be used later.

The release of the cast solder 41, from the mold 50, is facilitated by the release draft angle 12, and if necessary, by using a vacuum assisted handler (not shown).

It is preferred that the filled mold 50, is stored in an inert atmosphere. This would prevent any oxidation of the cast solder that may be exposed.

The filled mold 50, having an array of cast solder interconnects 41, can also now be easily inspected prior to any joining, such as, for example, to a carrier or semiconductor device.

Figure 3:
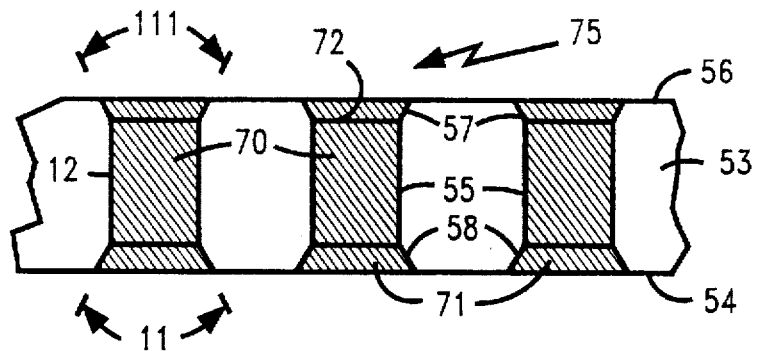
FIG. 3, illustrates a cross-sectional side view of a mold having pre-formed metallic features that were formed in an environment that had relatively higher oxygen content.

FIG. 3, illustrates a mold 53, having through-hole 55, a dual taper or flare 57 and 58. The taper 57, is on the upper surface 56, while the second taper 58, is on the lower surface 54, of the mold 53. The filling of the mold 53, is accomplished by aligning the lower surface 54, of the mold 53, against a flat or backing plate. The flat plate chosen for this application was made from graphite, however, any compatible material, depending upon the application, can be used.

The unfilled mold 53, was heated to about 345° C. minimum, and then this assembly was driven under the injection head of a solder injection molding machine. Solder 70, was then injected into the through-hole 55. For most applications it is preferred to have some extra material at the tip 72, of the solder 70, at the open end of the hole 55. However, for some applications and with the use of processes and equipment well known in the art the area 72, might be kept flush with the upper surface 56, of the mold 53.

As stated earlier that the process of filling the cavities 55, with the solder 70, itself is limited in speed by the liquid flow rate within the solder injection head and the mold heating capacity of the equipment.

The solder 70, of FIG. 3, was deposited in an atmosphere containing higher level of oxygen (such as, for example, higher than 2,000 PPM of oxygen by volume) than in FIG. 2. As can be clearly seen in FIG. 3, the cast solder 70, has a head 71, and a tip 72.

After the solder 70, has solidified, the filled mold 53, is separated from the baseplate to form filled or cast mold 75. The filled mold 75, can now either be used to immediately attach the cast solder 70, to a carrier or the cast mold 75, could be stored as a stocked item to be used later.

The release of the cast solder 70, from the filled mold 75, is facilitated by the release taper 12, and if necessary, by using a vacuum assisted handler.

It is preferred that the filled mold 75, is stored in an inert atmosphere. This would prevent any oxidation of the cast solder that may be exposed.

The cast mold 75, having an array of cast solder interconnects 70, can now be easily inspected and/or weighed prior to any joining to a carrier or semiconductor device.

The apparatus of this invention can also be used with multi-step molds, where molds are progressively aligned and filled with varying materials to meet end product objectives. These are castings that are formed by successively depositing decreasing melting point material. This is done by mating a second mold layer to the first filled mold. The second mold's material has a lower melting point material and therefore it joins with the cast material in the first mold.

An example of this multi-material casting would be the casting of a first electrical interconnect having for example, by weight, about 10 percent Sn and about 90 percent Pb solder (having a liquidus temperature of about 302° C.) in a first mold, and then securing a second mold having Sn/Pb solder, such as a 63 percent Pb and 37 percent Sn (having a liquidus temperature of about 183° C.) layer that has been cast in a second mold. Such a combination enables the attachment of the interconnects that are formed by the cast solder at minimal temperature. The resulting array exhibits close control of solder volumes, at low cost, with desirable fatigue characteristics. Unless otherwise specified, all compositions of the cast material are in weight percent.

Figure 4:
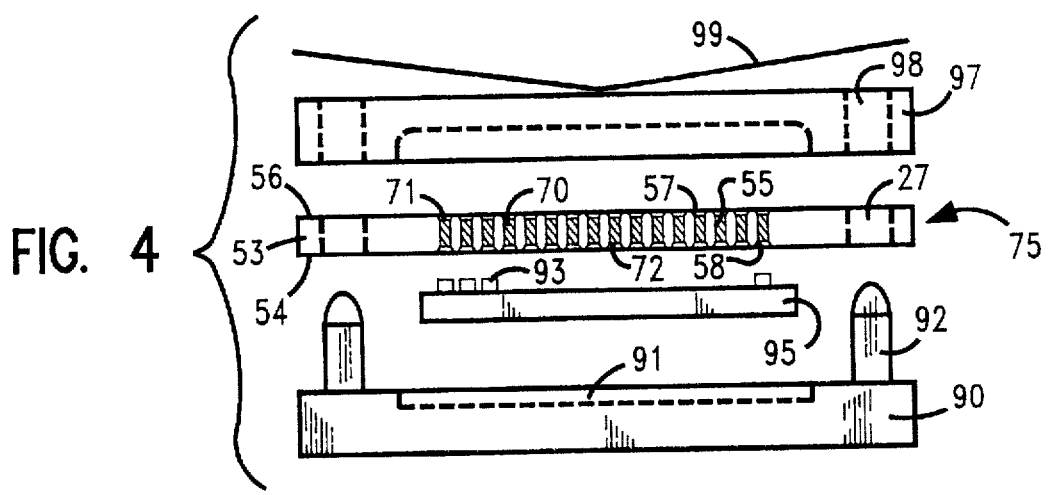
FIG. 4, is a preferred embodiment of an apparatus that is used to transfer the metallic interconnections of this invention onto a carrier.

FIG. 4, is a preferred embodiment of an apparatus that is used to transfer the solder connections of this invention on to a carrier, such as, a semiconductor device. Referring now to FIG. 4, there is shown an electronic package comprising a carrier 95, such as, a ceramic substrate carrier 95, which will have secured to it an array of cast solder electrical interconnect columns 70. To enhance wettability or transfer, the carrier 95, should have an array of mating structures or surfaces 93, such as, pads 93.

For example, in order to form the Column Grid Array (CGA) interconnection, the cast or filled mold 50 or 75, must be aligned to the part 95. This can be done as an adjustable fixture set that is best fit aligned to designated features, or with set reference locators that maintain adequate registration within a tolerance budget.

The fixture for transferring the cast electrical interconnects is basically comprised of an adjustable base plate 90, and a cover 97. The base plate 90, preferably has at least one alignment means, such as an alignment pin 92, and a cavity or area 91, to accommodate and nest a portion of a semiconductor carrier or workpiece 95.

The base 90, preferably consists of the necessary hardware to allow fine adjustments and locking of the positioning of the part 95, in the base cavity 91.

An alignment gauge or gauge plate (not shown) is used to position the substrate or part or workpiece 95, in the base 90. The alignment gauge is a thin, dimensionally stable material with the same alignment features 27, as the mold 23. The feature pattern 25, in the mold is represented by an array of apertures in the gauge plate that permit optical registration of the part 95, to the gauge plate. The alignment aperture centers are identically positioned relative to the alignment means 27, in the mold 23. Therefore, once the part 95, is adequately aligned to the gauge, the alignment gauge is then removed from the fixture set, and the filled mold 75, is then installed over the aligned part or workpiece 95.

The filled mold, such as, mold 50 or 75, is then placed over the carrier 95, such that, at least one alignment opening 27, passes through the alignment pin 92. The cover 97, having at least one biasing means 99, and at least one alignment opening 98, is placed over the cast mold, such as, the mold 75, such that the alignment pin 92, passes through the alignment opening 98. The cover 97, in conjunction with the biasing means 99, such as, for example, clamp spring 99, ensures contact between the mold 50 or 75, and the surface of the substrate 95. This whole assembly is then closed, so that the biasing means 99, can apply pressure and force the carrier 95, to be flush and in direct contact with the cast mold 75.

The adjustable base plate 90, is preferably used to align the substrate 95, to the filled mold 75. For some applications, flux may sparingly be applied to the surface of the substrate 95, on which the array of the cast solder interconnects 55, are to be attached. This helps to reduce oxide sensitivity and enhances wetting of the part.

Optionally, flux may be applied to the mold 75, and/or cover 97, to create a localized reducing atmosphere.

This assembly comprising filled or cast mold 50 or 75, and the substrate 95, along with the base plate 90, and cover 97, are then processed through a furnace. For the preferred 90 percent Pb/10 percent Sn (by weight) solder electrical interconnect, the assembly was heated to a temperature of about 320° C. for about 1.5 to about 5.0 minutes, attaining a peak temperature between about 345° C. and about 365° C. A non-oxidizing furnace atmosphere, such as, for example, argon, carbon dioxide, helium, hydrogen, nitrogen or forming gas, was preferably utilized for the reflow cycle. During furnace reflow cycle the cast solder preforms become molten and joined to the metallized pads 93, of the substrate 95.

If the metallic material chosen for molding is a solder, then it is preferred that the liquidus temperature of the solder is between about 180° C. and about 380° C., and more preferably between about 200° C. and about 365° C., and most preferably between about 225° C. and about 365° C.

For some applications these cast arrays of columns could be connected to an organic board utilizing a low melting point solder.

Figure 5:
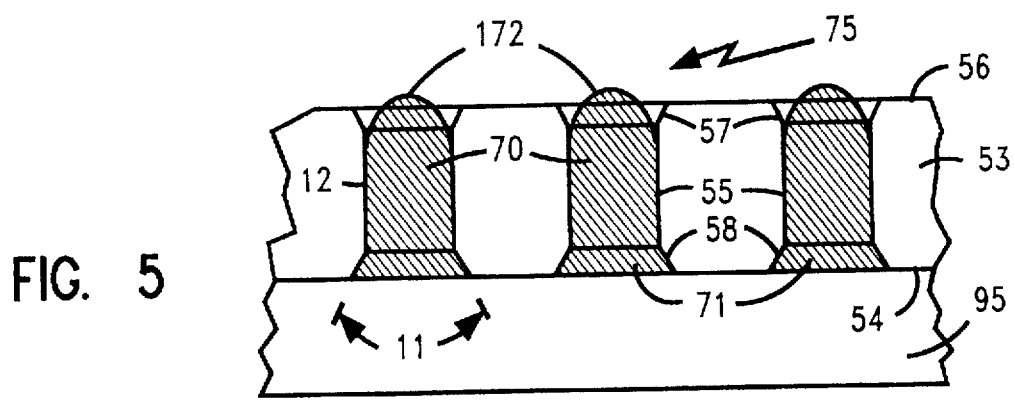
FIG. 5, illustrates a cross-sectional side view of a mold after the metallic material has been reflowed onto the workpiece.

FIG. 5, shows the metallic interconnect 70, after it has been transferred onto the workpiece 95. As can be clearly seen that during solder reflow, the solder tends to form a spherically shaped tip 172, which draws the solder out of the retention chamfer 57, thus allowing for the removal or extraction of the mold 53, from the part 95. The depth and angle of the retention chamfer 57, must be sized to allow this solder release after reflow. After the metallic interconnect 70, has been transferred and secured onto the part 95, the mold 53, is then removed, as more clearly seen in FIG. 6.

Figure 6:
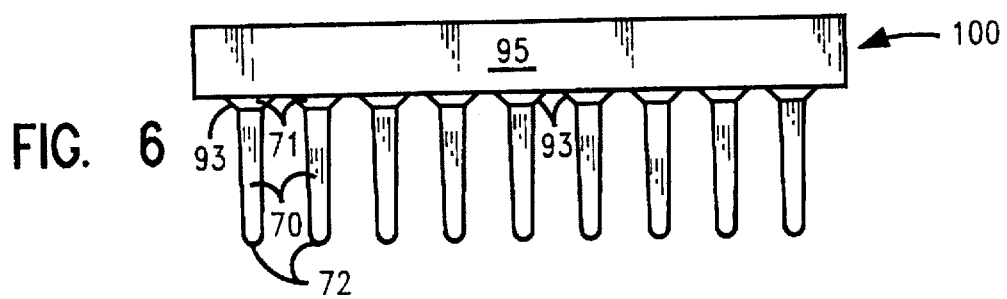
FIG. 6, is a side view of an example of a semiconductor device where solder interconnections were placed on it using the apparatus and method of this invention.

FIG. 6, is an embodiment of a semiconductor device 95, having, for example, solder connections 70, placed on it using the apparatus and method of this invention. After the solder interconnects 70, have been physically connected to the substrate 95, the mold 75, is removed. This results in a semiconductor carrier 100, having a substrate 95, with attached solder interconnects 71, etc. The carrier 100, could now be used to interconnect, for example, to a printed circuit board (not shown), or similar such electrical device.

Figure 7:
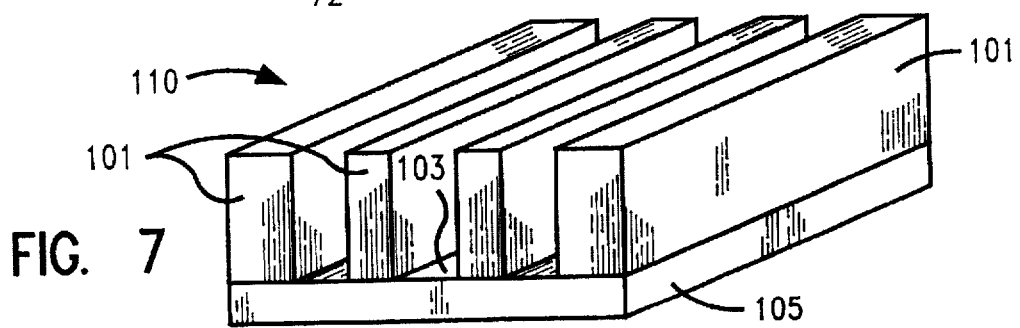
FIG. 7, is an example of a heat sink, where the fins for the heat sink were transferred to form the heat sink using the apparatus and process of this invention.

FIG. 7, is yet another application of previously molded material transfer in the form of a high density heat sink 110. The molded metallic features 101, in the form of fins, columns, or tabs, are aligned to a wettable surface 103, such as, on an electrical assembly, a heat sink base or semiconductor base or cover 105, to name a few. The subsequent reflow cycle will cause the cast metallic features 101, to reflow and attach to a portion of the surface 103.

The heat sink array may be utilized as a surface to air type, or as a redundant heat dissipation path in parallel with signal or voltage carrying columns or ball like structures in an array. The latter type connection uses conduction to other surfaces as a thermal path.

For some applications, as stated earlier, the heating of the assembly, for example, the assembly of FIG. 4, is done in an inert atmosphere or reducing atmosphere. However, the atmosphere could be selected from a group comprising of argon atmosphere, carbon dioxide atmosphere, forming gas atmosphere, helium atmosphere, hydrogen atmosphere or nitrogen atmosphere, to name a few.

The solder injection or extrusion filling of molds for either direct cast/joining or casting for subsequent joining places demands on the physical configuration and material selection of the mold. For example, the mold cavities can be designed with straight or angled sides, so that the cast solder can be easily ejected as a finished part or preform or joined array. Similarly, extraction draft angle also helps to reduce the force that is needed during the removal of the mold after the cast solder has been joined to a semiconductor device.

Solder cast feature aspect ratio has significant bearing on the draft angle requirement. Arrays of cast solder features with aspect ratios (length:width) in excess of 20:1 have successfully been made with draft angles as low as one degree. It was noticed that solder cast features of small size and repetition per mold with less than a 1:1 aspect ratio could sometimes forgo the need for release angle, depending upon the force needed to overcome the initial breakaway and the strength of the mold material.

Different types of molds were made and tested. Molds can be of blind or through hole design.

The method of filling the mold with the solder material has direct bearing on mold cavity orientation due to the fill forces involved. Injection Molded Solder (IMS) process utilizes atmospherically evacuated mold voids to induce filling as opposed to extrusion methods utilizing positive pressure. In the case of through-hole molds, using IMS applications, filling from the smaller opening was preferred due to the decreased likelihood of cross-leakage (from solder supply to evacuation port area). It was found that extrusion methods generally favor a decreasing cross-section for void-free fill.

Taper can also be a useful molded material retention feature, especially when molds are filled and stocked. This may take the form of a single taper 35, as shown in FIG. 2, or dual taper 57 and 58, as illustrated in FIG. 3. The dual taper was found to enhance ease of handling. The release of dual taper features depends upon the volume displacement that occurs during subsequent attach, such as, by wetting, as seen more clearly in FIG. 5.

For most applications it is preferred that the flare, such as flare 11 or 111, is between about 1 degree to about 80 degree, and more preferably between about 5 degree to about 45 degree, and most preferably between about 5 degree to about 30 degree.

Still another angle or compound angle application serves to ensure positive molten material contact with the attachment or "wetted" surfaces involving the employment of a shallow annular design feature. This utilizes the tendency of molten materials to assume a spherical shape, especially in an inert atmosphere.

It has been seen that a feature with a shallow flare at one extremity can be cast with a relatively flat surface on this end. Upon being positioned adjacent to a wettable surface and achieving melting temperature, the flat area will tend to bulge out. This allows accommodation of considerable gaps between mold and attachment surface due to part (substrate) flatness and positioning tolerances. The limitation of the aforementioned wettable surface will define the extent of the material deposition.

Locating and alignment considerations become mandatory for mold applications with high feature counts and/or small size. These positioning designs may be simple locator surfaces or interact with an alignment mechanism that enables optimal alignment of mold array to an attachment pattern or registration mark(s) on an end product. The pattern and edge tolerances of parts to be processed will best define the degree of locating sophistication needed.

Molding of finished shapes, such as pins, spheres, bullets and others, is accomplished by providing for ejection and possible re-processing to achieve the ultimate desired shape. The close control of casting material volume possible with this method is advantageous to this application.

The mold material that is selected must be able to maintain dimensional stability throughout the expected number of molding cycles. Similarly, the mold material must be able to provide continuous service at the desired process temperatures. Maintenance of flatness and surface finish is critical for injection molding. The surface condition, internal grain structure and gas permeability of mold materials will affect mold fill, casting yield, release performance and durability. As cast feature size decreases (on the order of about 0.5 mm or less) the sensitivity of the process to effects of surface tension, gas entrapment, and molding medium viscosity increases.

For array transfer applications, the mold material that is selected also needs to possess a close thermal coefficient of expansion value to the particular device or substrate that the molded array will be attached to. Incompatible coefficients of expansion will result in problems with registration, stress distortion of mold or part or both, and difficult array extraction. In the case of rapid heating and cooling processes, attention needs to be paid to rates of emissivity and heat transfer for the same reasons, although mass compensation and shadowing techniques can be utilized to minimize the effects of this type of a mismatch. The range of thermal excursion experienced by solder casting processes requires expansion matching of the entire alignment hardware set.

Another requirement for the mold material is that it be inert with regard to the casting medium. It should not chemically interact with the materials cast in any way. This affects the longevity of the mold, as some materials (liquid solder) are somewhat reactive to metallic molds and mold aligning.

Mold/fixture erosion also represents a contamination source to the resulting castings. Molding generated contaminants should be carefully considered. A contaminated cast array may possess sufficient structural integrity to withstand manufacturing, testing and assembly stresses, but subsequently fatigue fail (prematurely) in service. This non-reactive requirement may be achieved through the use of surface treatments such as anodizing or vitrification, with attention to the surface condition and permeability effects as mentioned previously.

The mold should be manufactured from a material having a coefficient of expansion matching the substrate, having properties of non-wettability to the solder, dimensional stability, and compatibility with the temperatures used during reflow. The preferred mold is a thermal expansion matched graphite.

The preferred mold design should contain a single or a double retention chamfer. This single or double chamfer allows for ease of mold handling prior to the joining of the molded solder to the substrate. As stated earlier that during the reflow process, the solder in the retention chamfer forms a rounded tip due to solder surface tension and thus allows for mold extraction. At the completion of the joining cycle, ejection hardware draws the mold from the joined solder column features.

One advantage of this invention is that the mold defines the exact shape of the feature to be manufactured. The solder within the mold undergoes minimal volume movement during the solder reflow attachment to the substrate. This is in contrast to preform methods which depend on gravity to provide uniform slump of mold material in spite of surface tension and surface films. This minimal displacement reduces the potential for casting defects due to surface oxides, contamination, and out-gassing. The use of pre-filled solder molds for forming interconnections results in significantly higher yields than were previously achievable.

Specific thermal mass, surface area, and emissivity characteristics of a given part and fixture will dictate exact heating and cooling parameters for a given application. The process itself will also dictate these parameters, for example, a complete re-melting of cast material or the melting of an attachment material such as a 63/37 (by weight) lead/tin solder.

As mentioned earlier, the exact shape of the transferred material 70 or 101, is defined by the interior shape of the cavities 25 or 55, in the mold 23 or 53, respectively.

EXAMPLE

The following example is intended to further illustrate the invention and is not intended to limit the scope of the invention in any manner.

Example 1

The process of transferring filled mold arrays 75, only requires a means of aligning the filled mold 75, to the part or workpiece 95, that the molded array of metallized material 70, is to join.

An alignment fixture 90, orients the filled mold 75, and part 95, by means of alignment openings 27. In case of close tolerance assemblies with many small features over a significant area, the fixture 90, should have the ability to adjust relative position of part 95, to mold 75. This minimizes the mold/part alignment difficulties due to edge registration, pattern center to center distortion, and pattern magnification.

A way to enable this precise alignment is to use an optical grid type of an alignment gauge that represents the feature centerlines of mold 75, relative to the orientation holes 27, in an accurate manner.

After the part 95, had been secured in the base of the fixture 90, the alignment or grid gauge was installed over pins 92. The alignment of part 95, relative to mold locating pins 92, was observed through the grid gauge, adjusted for optimal alignment, and locked in place.

The grid gauge was then removed, and filled mold 75, was then installed over pins 92. Since the mold 75, and the grid gauge have the same array centerlines, relative to pins 92, the molded features 70, contained in mold 75, were precisely aligned to designated area 93, of the part 95.

The cover 97, was then installed to maintain vertical contact between the part 95, and the mold 75. The weight of the mold 75, alone is not usually a reliable means of maintaining full contact between the mold 75, and the part 95.

A biasing means 99, such as, a spring 99, was used to ensure contact between the mold 75, and part 95. This is especially true of high density pin array type features with a fillet-like attachment area.

A controlled atmosphere belt furnace was used to obtain the proper heating and cooling of the mold 75, and part 95, which resulted in the metallic material 70, being transferred onto the carrier 95, and secured thereto.

The fixture was disassembled and the empty mold 53, was removed from the assembly or apparatus as shown in FIG. 4, resulting for example, in a semiconductor carrier 100, having metallic interconnect features 70, as shown in FIG. 6.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method of transferring cast electrical interconnects from a mold to an attachment pad, comprising the steps of:
   (a) placing a workpiece having said attachment pad onto a base having at least one alignment means,
   (b) placing said mold over said workpiece such that said alignment means aligns at least a portion of one of said electrical interconnects in physical contact with at least a portion of said pad,
   (c) placing at least one biasing means over said mold and forming an assembly with said base, mold and workpiece,
   (d) heating said assembly to a temperature where at least a portion of said electrical interconnects in contact with said pad melts and forms an electrical connection with said pad, and
   (e) cooling said assembly and removing said biasing means, said mold and thereby forming said workpiece having said attachment pad with said cast electrical interconnects.

2. The method of claim 1, wherein said mold material is selected from a group consisting of boron nitride, ceramic, copper, epoxy, glass, graphite, metals, metal ceramics, molybdenum, plastics, polyimides and silicon.

3. The method of claim 1, wherein the material for said electrical interconnects is selected from a group consisting of aluminum, antimony, bismuth, conductive epoxies, copper, gold, lead, silver, solder and tin.

4. The method of claim 3, wherein said solder consists by weight of between about 1 percent to about 97 percent lead.

5. The method of claim 3, wherein said solder consists by weight of between about 99 percent to about 3 percent tin.

6. The method of claim 3, wherein said solder consists by weight of between about 37 percent to about 95 percent lead.

7. The method of claim 3, wherein said solder consists by weight of about 90 percent lead.

8. The method of claim 3, wherein said solder consists by weight of between about 63 percent to about 5 percent tin.

9. The method of claim 3, wherein said solder consists by weight of about 10 percent tin.

10. The method of claim 1, wherein the material for said electrical interconnects is a solder, and wherein the liquidus temperature of said solder is between about 180° C. and about 380° C.

11. The method of claim 1, wherein said hole has a flare at at least one end.

12. The method of claim 11, wherein at least one of said flare is between about 1 degree to about 80 degree.

13. The method of claim 11, wherein at least one of said flare is between about 5 degree to about 45 degree.

14. The method of claim 11, wherein at least one of said flare is between about 5 degree to about 30 degree.

15. The method of claim 1, wherein the material for said electrical interconnects is a solder, and wherein the liquidus temperature of said solder is between about 200° C. and about 365° C.

16. The method of claim 1, wherein the material for said electrical interconnects is a solder, and wherein the liquidus temperature of said solder is between about 225° C. and about 365° C.

17. The method of claim 1, wherein at least one alignment gauge is used to align said workpiece to said base.

18. The method of claim 1, wherein at least one of said electrical interconnects is used as a means for transferring heat.

19. The method of claim 1, wherein said heating step is done in an atmosphere selected from a group consisting of inert atmosphere and reducing atmosphere.

20. The method of claim 19, wherein said atmosphere is selected from a group consisting of argon atmosphere, carbon dioxide atmosphere, forming gas atmosphere, helium atmosphere, hydrogen atmosphere and nitrogen atmosphere.

21. The method of claim 1, wherein said mold has at least one backing plate secured to it, and wherein said backing plate is removed after said electrical interconnects have been transferred from said mold onto said workpiece.

22. The method of claim 1, wherein said attachment pad is an electrical interconnection pad.

23. The method of claim 1, wherein said workpiece is selected from a group consisting of board, card, ceramics, chip, glass-ceramics, heat-sink, laminate and semiconductor substrate.

24. A method of transferring cast metallic material from a mold to a workpiece, comprising the steps of:
   (a) placing said workpiece onto a base having at least one alignment means,
   (b) placing said mold over said workpiece such that said alignment means aligns at least a portion of said metallic material in physical contact with at least a portion of said workpiece,
   (c) placing at least one biasing means over said mold and forming an assembly with said base, mold and workpiece,
   (d) heating said assembly to a temperature where at least a portion of said metallic material in contact with said workpiece melts and forms a connection with said workpiece, and
   (e) cooling said assembly and removing said biasing means and said mold, and thereby forming said workpiece having said cast metallic material.

25. The method of claim 24, wherein said mold material is selected from a group consisting of boron nitride, ceramic, copper, epoxy, glass, graphite, metals, metal ceramics, molybdenum, plastics, polyimides and silicon.

26. The method of claim 24, wherein said metallic material is selected from a group consisting of aluminum, antimony, bismuth, conductive epoxies, copper, gold, lead, silver, solder and tin.

27. The method of claim 26, wherein said solder consists by weight of between about 1 percent to about 97 percent lead.

28. The method of claim 26, wherein said solder consists by weight of between about 99 percent to about 3 percent tin.

29. The method of claim 26, wherein said solder consists by weight of between about 37 percent to about 95 percent lead.

30. The method of claim 26, wherein said solder consists by weight of about 90 percent lead.

31. The method of claim 26, wherein said solder consists by weight of between about 63 percent to about 5 percent tin.

32. The method of claim 26, wherein said solder consists by weight of about 10 percent tin.

33. The method of claim 24, wherein said metallic material is a solder, and wherein the liquidus temperature of said solder is between about 180° C. and about 380° C.

34. The method of claim 24, wherein said mold has at least one hole, and wherein said hole has a flare at at least one end.

35. The method of claim 34, wherein said flare is between about 1 degree to about 80 degree.

36. The method of claim 34, wherein said flare is between about 5 degree to about 45 degree.

37. The method of claim 34, wherein said flare is between about 5 degree to about 30 degree.

38. The method of claim 24, wherein said metallic material is a solder, and wherein the liquidus temperature of said solder is between about 200° C. and about 365° C.

39. The method of claim 24, wherein said metallic material is a solder, and wherein the liquidus temperature of said solder is between about 225° C. and about 365° C.

40. The method of claim 24, wherein at least one alignment gauge is used to align said workpiece to said base.

41. The method of claim 24, wherein at least one of said metallic material is used as a means for transferring heat.

42. The method of claim 24, wherein said heating step is done in an atmosphere selected from a group consisting of inert atmosphere and reducing atmosphere.

43. The method of claim 42, wherein said atmosphere is selected from a group consisting of argon atmosphere, carbon dioxide atmosphere, forming gas atmosphere, helium atmosphere, hydrogen atmosphere and nitrogen atmosphere.

44. The method of claim 24, wherein said mold has at least one backing plate secured to it, and wherein said backing plate is removed after said metallic material have been transferred from said mold onto said workpiece.

45. The method of claim 24, wherein said workpiece is selected from a group consisting of board, card, ceramics, chip, glass-ceramics, heat-sink, laminate or semiconductor substrate.

46. An apparatus for transferring cast metallic material in a mold onto a workpiece, comprising:
   (a) a base having at least one alignment pin,
   (b) at least one area in said base to accommodate said workpiece, said workpiece in said area,
   (c) means for placing and aligning said mold over said workpiece,
   (d) at least one biasing means over said mold to securely hold said mold in contact with said workpiece,
   (e) a heating means to heat said assembly comprising said biasing means, said mold, said workpiece and said base until said cast metallic material in said mold is transferred onto said workpiece, and
   (f) a cooling means to cool said assembly and thereby providing said apparatus for transferring cast metallic material in a mold onto a workpiece.

47. The apparatus of claim 46, wherein said mold material is selected from a group consisting of boron nitride, ceramic, copper, epoxy, glass, graphite, metals, metal ceramics, molybdenum, plastics, polyimides and silicon.

48. The apparatus of claim 46, wherein said metallic material is selected from a group consisting of aluminum, antimony, bismuth, conductive epoxies, copper, gold, lead, silver, solder and tin.

49. The apparatus of claim 48, wherein said solder consists by weight of between about 1 percent to about 97 percent lead.

50. The apparatus of claim 48, wherein said solder consists by weight of between about 99 percent to about 3 percent tin.

51. The apparatus of claim 48, wherein said solder consists by weight of between about 37 percent to about 95 percent lead.

52. The apparatus of claim 48, wherein said solder consists by weight of about 90 percent lead.

53. The apparatus of claim 48, wherein said solder consists by weight of between about 63 percent to about 5 percent tin.

54. The apparatus of claim 48, wherein said solder consists by weight of about 10 percent tin.

55. The apparatus of claim 46, wherein said metallic material is a solder, and wherein the liquidus temperature of said solder is between about 180° C. and about 380° C.

56. The apparatus of claim 46, wherein said mold has at least one hole, and wherein said hole has a flare at at least one end.

57. The apparatus of claim 56, wherein said flare is between about 1 degree to about 80 degree.

58. The apparatus of claim 56, wherein said flare is between about 5 degree to about 45 degree.

59. The apparatus of claim 56, wherein said flare is between about 5 degree to about 30 degree.

60. The apparatus of claim 46, wherein at least one alignment gauge is used to align said workpiece to said base.

61. The apparatus of claim 46, wherein said metallic material is used as a means for transferring heat.

62. The apparatus of claim 46, wherein said heating step is done in an atmosphere selected from a group consisting of inert atmosphere and reducing atmosphere.

63. The apparatus of claim 62, wherein said atmosphere is selected from a group consisting of argon atmosphere, carbon dioxide atmosphere, forming gas atmosphere, helium atmosphere, hydrogen atmosphere and nitrogen atmosphere.

64. The apparatus of claim 46, wherein said mold has at least one backing plate secured to it, and wherein said backing plate is removed after said metallic material have been transferred from said mold onto said workpiece.

65. The apparatus of claim 46, wherein said workpiece is selected from a group consisting of board, card, ceramics, chip, glass-ceramics, heat-sink, laminate and semiconductor substrate.

66. The apparatus of claim 46, wherein said metallic material is a solder, and wherein the liquidus temperature of said solder is between about 200° C. and about 365° C.

67. The apparatus of claim 46, wherein said metallic material is a solder, and wherein the liquidus temperature of said solder is between about 225° C. and about 365° C.

* * * * *